(12) United States Patent
Li et al.

(10) Patent No.: US 8,338,077 B2
(45) Date of Patent: Dec. 25, 2012

(54) PHOTOACID GENERATORS AND PHOTORESISTS COMPRISING SAME

(75) Inventors: Mingqi Li, Shrewsbury, MA (US); Cheng-Bai Xu, Southborough, MA (US); Emad Aqad, Shrewsbury, MA (US); Cong Liu, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 105 days.

(21) Appl. No.: 12/820,331

(22) Filed: Jun. 22, 2010

(65) Prior Publication Data

US 2010/0323294 A1    Dec. 23, 2010

Related U.S. Application Data

(60) Provisional application No. 61/219,355, filed on Jun. 22, 2009.

(51) Int. Cl.
    G03F 7/028 (2006.01)
    G03F 7/029 (2006.01)
    G03F 7/039 (2006.01)
    G03F 7/26  (2006.01)

(52) U.S. Cl. ............ 430/270.1; 430/326; 430/921; 430/925

(58) Field of Classification Search ............ 430/270.1, 430/326, 921, 922, 923, 924, 925; 549/243, 549/268, 269
See application file for complete search history.

(56) References Cited

U.S. PATENT DOCUMENTS

| | | | |
|---|---|---|---|
| 2007/0078269 A1* | 4/2007 | Harada et al. | 549/266 |
| 2009/0068591 A1* | 3/2009 | Kawaue et al. | 430/285.1 |
| 2009/0269694 A1* | 10/2009 | Shimizu et al. | 430/270.1 |
| 2010/0167178 A1* | 7/2010 | Yamato et al. | 430/2 |
| 2011/0250538 A1* | 10/2011 | Li et al. | 430/270.1 |
| 2011/0269070 A1* | 11/2011 | Aqad et al. | 430/270.1 |

FOREIGN PATENT DOCUMENTS

WO    WO 2007/147782    * 12/2007

* cited by examiner

*Primary Examiner* — Anca Eoff
(74) *Attorney, Agent, or Firm* — Peter F. Corless; Darryl P. Frickey; Edwards Wildman Palmer LLP

(57) ABSTRACT

This invention relates to new photoacid generator compounds and photoresist compositions that comprise such compounds. In particular, the invention relates to photoacid generator compounds that comprise a multi cyclic lactone moiety.

2 Claims, No Drawings

PHOTOACID GENERATORS AND PHOTORESISTS COMPRISING SAME

This application claims the benefit of priority under 35 U.S.C. §119(e) to U.S. Provisional Application No. 61/219,355, filed Jun. 22, 2009, the contents of which application are incorporated herein by reference.

This invention relates to new photoacid generator compounds ("PAGs") and photoresist compositions that comprise such compounds. In particular, the invention relates to photoacid generator compounds that comprise multi cyclic lactone groups. Positive- and negative-acting chemically amplified resists that contain such PAGs and that are imaged with short wavelength radiation such as sub-300 nm and sub-200 nm radiation are particularly preferred.

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

Known photoresists can provide features having resolution and size sufficient for many existing commercial applications. However for many other applications, the need exists for new photoresists that can provide highly resolved images of submicron dimension.

Various attempts have been made to alter the make-up of photoresist compositions to improve performance of functional properties. Among other things, a variety of photoactive compounds have been reported for use in photoresist compositions. See U.S. 2008/0124656.

We have now discovered novel photoacid generator compounds (PAGs) for use in either positive-acting or negative-acting photoresist compositions. In particular, photoacid generator compounds are provided that comprise a multicyclic lactone group.

As referred to herein, "multicyclic lactone" unit, group or other designations indicates a moiety that comprises 1) a lactone group that is 2) covalently linked (e.g. including but not limited to, fused) to one or more preferably two or more other non-aromatic rings. As disclosed below, in preferred aspects, at least one of the rings covalently linked to the lactone ring comprises a ring atom other than carbon such as oxygen or sulfur (includes S, S(O), S(O)$_2$), e.g. an oxygen or sulfur bridge group. Also, references herein to lactone include thio lactones, and rings with oxygen atoms only forming the lactone moiety, as well as rings where other hetero atoms particularly sulfur form the lactone group (thiolactones and other configurations). It is also understood that a "multicyclic lactone" group may comprise one or more covalently linked (e.g. fused) carbon alicyclic moieties (i.e. where all ring members are carbon).

In particular preferred aspects, photoacid generator compounds are provided that comprise a multicyclic lactone group having at least one heterocyclic group in addition to a lactone moiety. For instance, the at least one heterocyclic group may be a fused or non-fused covalently linked ring having at least one oxygen and/or sulfur (including functionalized sulfur such as sulfinyl and sulfonyl) ring atom.

In additional preferred aspects, photoacid generator compounds are provided that comprise a multicyclic lactone group having one or more non-hydrogen ring substituents such as e.g. hydroxy, optionally substituted alkyl including hydroxyalkyl, alkyl, cyano, optionally substituted alkoxy. Hydroxy or hydroxyalkyl are especially preferred ring substituents of a present PAG multicyclic lactone group.

Photoacid generator compounds of the invention include both ionic and non-ionic compounds, such as e.g. The $\alpha,\alpha$-difluoroalkyl sulfonic acid can be photo-generated from a variety of photoreactive molecules, including ionic compounds, such as an onium salt, as well as non-ionic compounds. Generally preferred PAG compounds of the invention that can generate an $\alpha,\alpha$-difluoroalkyl sulfonic acid upon photoactivation include onium compounds such as sulfonium and iodonium compounds; and sulfonate compounds such as N-oxyimidosulfonates, N-oxyiminosulfonates, phenolic sulfonates arylalkylsulfonates particularly benzylic sulfonates; disulfones; diazosulfones; $\alpha,\alpha$-methylenedisulfones, and disulfonylhydrazines.

In certain aspects, preferred are ionic photoacid generator compounds, particularly PAG compounds generate a sulfonic acid (—SO$_3^-$) upon photoactivation.

In additional preferred aspects, a multi cyclic lactone group is present on the anion portion of anionic PAG. For example, preferred are ionic PAGS where a multi cyclic lactone group is covalently linked to a sulfonic acid (—SO$_3^-$) moiety.

In an especially preferred aspect, fluorinated PAGS are provided that comprises a multi cyclic lactone. Particularly preferred are fluorinated PAGS are provided that comprises a multi cyclic lactone and generate a sulfonic acid (—SO$_3^-$) upon photoactivation, e.g. where a fluorinated sulfonic acid group (e.g. —CF$_2$SO$_3^-$, —CHFSO$_3^-$, -(ester)CF$_2$SO$_3^-$, -(ester)CHFSO$_3$.

Preferably, PAGs of the invention are used in positive-acting or negative-acting chemically amplified photoresists, i.e. negative-acting resist compositions which undergo a photoacid-promoted crosslinking reaction to render exposed regions of a coating layer of the resist less developer soluble than unexposed regions, and positive-acting resist compositions which undergo a photoacid-promoted deprotection reaction of acid labile groups of one or more composition components to render exposed regions of a coating layer of the resist more soluble in an aqueous developer than unexposed regions. Preferred imaging wavelengths are sub-300 nm and sub-200 nm such as 248 nm, 193 nm and 157 nm. Longer wavelengths such as I-line (365 nm) also can be employed.

Particularly preferred photoresists of the invention contain an imaging-effective amount of one or more PAGs as disclosed herein and a resin that is selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate (which includes (meth)acrylates) units can undergo a deblocking reaction in the presence of photoacid. Exemplary alkyl acrylates (which includes (meth)acrylates) that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates (which includes (meth)acrylates) that can undergo a photoacid-induced reaction; such polymers have been described in U.S.

Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate (which includes (meth) acrylates) such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups, such as polymers as described in U.S. Pat. Nos. 5,929,176 and 6,090,526, incorporated herein by reference.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624 and 6,048,664, incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, filed Aug. 28, 1998, all incorporated herein by reference; and iii) polymers that contain polymerized anhydride units, particularly polymerized maleic anhydride and/or itaconic anhydride units, such as disclosed in European Published Application EP01008913A1 and U.S. Pat. No. 6,048,662, both incorporated herein by reference; and/or combinations of one or more resins of types i), ii) or iii), i.e. combinations of one or more of polymers that polymerized units of a non-aromatic cyclic olefin, polymers that contain alkyl acrylates (which includes (meth)acrylates); and/or polymers that contain polymerized anhydride units.

Resists of the invention also may comprise a mixture of distinct PAGs, typically a mixture of 2 or 3 different PAGs, more typically a mixture that consists of a total of 2 distinct PAGs. At least one PAG of the mixture have a multi cyclic lactone group as disclosed herein.

The invention also provide methods for forming relief images of the photoresists of the invention, including methods for forming highly resolved patterned photoresist images (e.g. a patterned line having essentially vertical sidewalls) of sub-quarter micron dimensions or less, such as sub-0.2 or sub-0.1 micron dimensions.

The invention further provides articles of manufacture comprising substrates such as a microelectronic wafer or a flat panel display substrate having coated thereon the photoresists and relief images of the invention. Other aspects of the invention are disclosed infra.

We have found that use of a photoacid generator compound of the invention in a photoresist composition can impart enhanced lithographic performance to the resist, including higher resolution resist relief images.

Preferred photoacid generator compounds include those comprising a structure of any of the following formulae I, II or III:

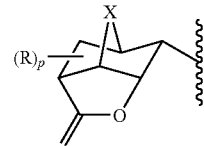

I

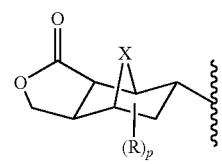

II

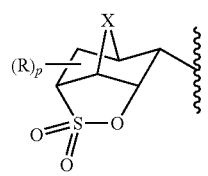

III wherein in each formulae X is $CH_2$, O or S, and preferably is O;

each R is the same or different a non-hydrogen substituent such as hydroxy, optionally substituted alkyl including hydroxyalkyl, alkyl, cyano, optionally substituted alkoxy;

p is an integer of from 0 (where the multicyclic group has no non-hydrogen ring substituents) to 5, more typically p is 0 to 3.

Particularly preferred PAGs of the invention comprise a multi cyclic lactone group covalently linked to a sulfonic acid portion of an ionic PAG. A variety of groups may be interposed between a multi cyclic lactone and sulfonic acid, e.g. esters, amides, optionally substituted alkylene (e.g. (—$CH_2$—)n where n is 1 to 10), fluoroalkylene (e.g. (—$CF_2$—)n where n is 1 to 10, more typically 1, 2 or 3) and the like.

Particularly preferred PAGS include that comprise the following anionic groups where R represents is a multi cyclic lactone group:

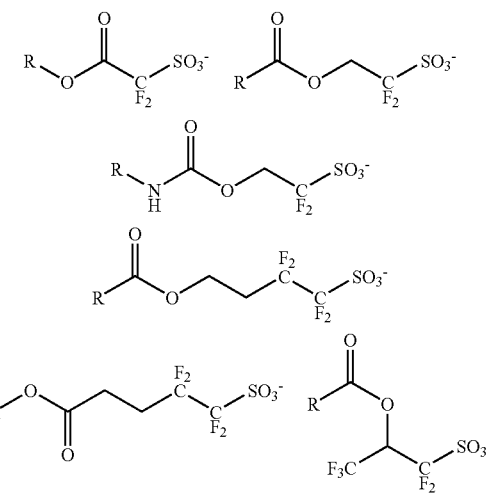

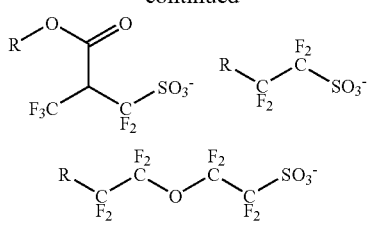

Additional preferred photoacid generator compound may comprise a structure of the following formulae IV, V or VI:

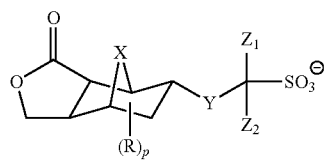

IV

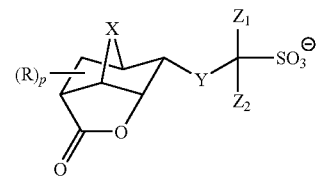

V

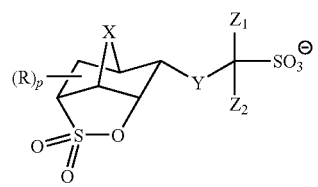

VI wherein in each formulae X is $CH_2$, O or S, and preferably is O;

each R is the same or different a non-hydrogen substituent such as hydroxyl, optionally substituted alkyl including hydroxyalkyl, alkyl, cyano, optionally substituted alkoxy;

p is an integer of from 0 (where the multicyclic group has no non-hydrogen ring substituents) to 5, more typically p is 0 to 3;

Y is a chemical linkage (which may include ester groups, including multiple ester groups in sequence);

$Z_1$ and $Z_2$ may be the same or different and may be hydrogen or a non-hydrogen group, with at least one of $Z_1$ and $Z_2$ comprising one or more F atoms.

Additionally preferred photoacid generator compounds of the invention include the following containing extended multicyclic lactone groups:

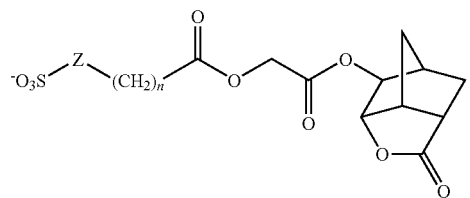

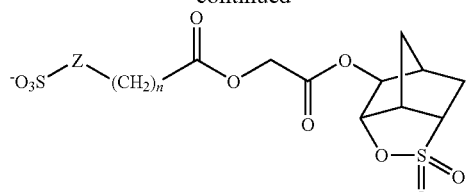

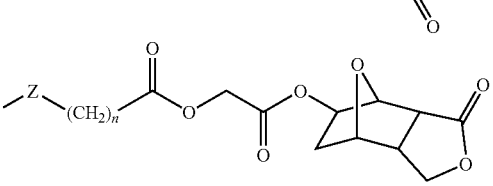

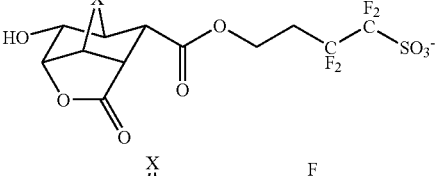

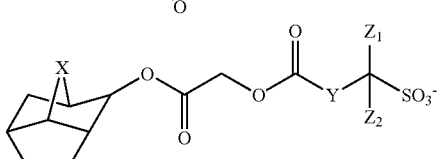

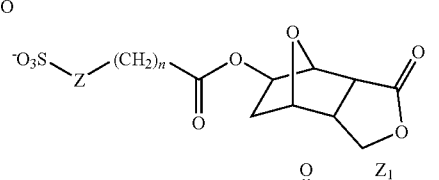

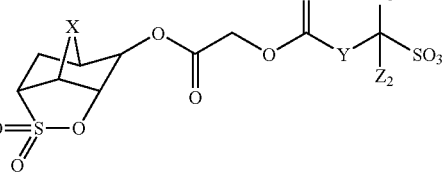

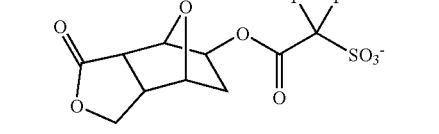

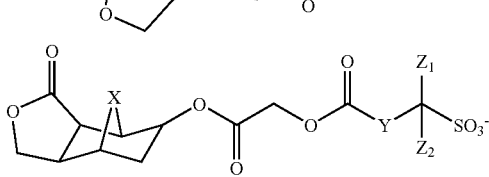

wherein in the above structures X is —CH$_2$— or oxygen; n is 0 to 6; Z is a chemical bond or fluorinated alkylene having 1 to 8 carbon atoms- The present PAGs can be readily prepared. For instance, a formed multicyclic lactone or anhydride compound such as 9-Hydroxy-4,10-dioxa-tricyclo[5.2.1.02,6]decan-3-one or cis-5-norbornene-Endo-2,3-dicarboxylic anhydride can be reacted to provide the desired functionality to form the targeted PAG compound. Thus, as illustrated in the examples which follow, a formed sulfonic acid compound with covalently linked multicyclic lactone moiety is complexed with an a cationic species (e.g. a sulfonium compound such as optionally substituted triaryl including optionally substituted triphenyl sulfonium cation, or an iodonium compound such as optionally substituted diphenyl iodonium).

Multi cyclic lactone groups also can be grafted onto or otherwise incorporated into other photoacid generator such N-oxyimidosulfonates, N-oxyiminosulfonates, phenolic sulfonates arylalkylsulfonates particularly benzylic sulfonates; disulfones; diazosulfones; α,α-methylenedisulfones, and disulfonylhydrazines. Such PAGs are discussed e.g. in U.S. Pat. Nos. 6,482,567; 6,849,374; 6,458,506; and 6,783,912.

As discussed above, PAGs of the invention are useful as the radiation sensitive component in photoresist compositions, including both positive-acting and negative-acting chemically amplified resist compositions.

The photoresists of the invention typically comprise a resin binder and a photoactive component of the invention as described above. Preferably the resin binder has functional groups that impart alkaline aqueous developability to the resist composition. For example, preferred are resin binders that comprise polar functional groups such as hydroxyl or carboxylate. Preferably the resin binder is used in a resist composition in an amount sufficient to render the resist developable with an aqueous alkaline solution.

For imaging at wavelengths greater than 200 nm, such as 248 nm, phenolic resins are typically preferred. Preferred phenolic resins are poly (vinylphenols) which may be formed by block polymerization, emulsion polymerization or solution polymerization of the corresponding monomers in the presence of a catalyst.

Preferably, a photoacid generator compound of the invention is employed in a chemically amplified positive-acting resist. A number of such resist compositions have been described, e.g., in U.S. Pat. Nos. 4,968,581; 4,883,740; 4,810, 613 and 4,491,628 and Canadian Patent Application 2,001, 384, all of which are incorporated herein by reference for their teaching of making and using chemically amplified positive-acting resists. In accordance with the present invention, those prior resist compositions are modified by substitution of the photoactive component of the invention as the radiation sensitive component.

Preferred resins that have acid-labile deblocking groups for use in a positive-acting chemically-amplified photoresist of the invention have been disclosed in European Patent Application 0829766A2 of the Shipley Company (resins with acetal and ketal resins) and European Patent Application EP0783136A2 of the Shipley Company (terpolymers and other copolymers including units of 1) styrene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

PAGs of the invention (also are preferably used with polymers that contain one or more photoacid-labile groups and that are substantially, essentially or completely free of phenyl or other aromatic groups. Such photoresist compositions are particularly useful for imaging with sub-200 nm radiation such as 193 nm radiation.

For example, preferred polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

Suitable polymers that are substantially or completely free of aromatic groups and may be formulated with a PAG of the invention to provide a photoresist for sub-200 nm imaging are disclosed in European application EP930542A1 of the Shipley Company.

Suitable polymers that are substantially or completely free of aromatic groups suitably contain acrylate units such as photoacid-labile acrylate units as may be provided by polymerization of methyladamantylacrylate, methyladamantylmethacrylate, ethylfenchylacrylate, ethylfenchylmethacrylate, and the like; fused non-aromatic alicyclic groups such as may be provided by polymerization of a norbornene compound or other alicyclic compound having an endocyclic carbon-carbon double bond; an anhydride such as may be provided by polymerization of maleic anhydride; and the like.

Preferred negative-acting compositions of the invention comprise a mixture of materials that will cure, crosslink or harden upon exposure to acid, and a photoactive component of the invention.

Preferred negative acting compositions comprise a resin binder such as a phenolic or non-aromatic resin, a crosslinker component and a photoactive component of the invention. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by Cytec under the trade names Cymel 300, 301 and 303. Glycoluril resins are sold by Cytec under trade names Cymel 1170, 1171, 1172, urea-based resins are sold under the trade names of Beetle 60, 65 and 80, and benzoguanamine resins are sold under the trade names Cymel 1123 and 1125.

Photoresists of the invention also may contain other materials. For example, other optional additives include actinic and contrast dyes, anti-striation agents, plasticizers, speed enhancers, sensitizers (e.g. for use of a PAG of the invention at longer wavelengths such as I-line), etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred optional additive of resists of the invention is an added base, particularly tetrabutylammonium hydroxide (TBAH), which can enhance resolution of a developed resist relief image. The added base is suitably used in relatively small amounts, e.g. about 1 to 10 percent by weight relative to the PAG, more typically 1 to about 5 weight percent. Other preferred basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, 2-(4-aminophenyl)-2-(4-hydroxyphenyl)propane, etc.

The resin binder component of resists of the invention are typically used in an amount sufficient to render an exposed coating layer of the resist developable such as with an aqueous alkaline solution. More particularly, a resin binder will suitably comprise 50 to about 90 weight percent of total solids of the resist. The photoactive component should be present in an amount sufficient to enable generation of a latent image in a coating layer of the resist. More specifically, the photoactive component will suitably be present in an amount of from about 1 to 40 weight percent of total solids of a resist. Typically, lesser amounts of the photoactive component will be suitable for chemically amplified resists.

The photoresists of the invention are generally prepared following known procedures with the exception that a PAG of the invention is substituted for prior photoactive compounds used in the formulation of such photoresists. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; lactates such as ethyl lactate or methyl lactate, with ethyl lactate being preferred; propionates, particularly methyl propionate, ethyl propionate and ethyl ethoxy propionate; or a ketone such as methylethyl ketone, cyclohexanone and 2-heptanone. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image.

The substrate on which a resist of the invention is applied and processed suitably can be any substrate used in processes involving photoresists such as a microelectronic wafer. For example, the substrate can be a silicon, silicon dioxide or aluminum-aluminum oxide microelectronic wafer. Gallium arsenide, ceramic, quartz or copper substrates may also be employed. Printed circuit board substrates such as copper clad laminates are also suitable substrates. Substrates used for liquid crystal display and other flat panel display applications are also suitably employed, e.g. glass substrates, indium tin oxide coated substrates and the like.

A liquid coating resist composition may be applied by any standard means such as spinning, dipping or roller coating. Photoresists of the invention also may be applied as dry film resists, particularly for printed circuit board manufacture applications.

The photoresist layer (with overcoated barrier composition layer, if present) in then exposed to activating radiation preferably in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposure energy should be sufficient to effectively activate the photoactive component of the radiation sensitive system to produce a patterned image in the resist coating layer. Suitable exposure energies typically range from about 1 to 300 mJ/cm$^2$. Suitable exposure wavelengths include sub-300 nm such as 248 nm or sub-200 nm such as 193 nm and 157 nm, or longer wavelengths such as 365 nm. Higher energy exposure sources also may be employed such as EUV, electron beam, ion beam and x-ray radiation, and other ionizing radiation. Suitable post-exposure bake temperatures are from about 50° C. or greater, more specifically from about 50 to 140° C. For an acid-hardening negative-acting resist, a post-development bake may be employed if desired at temperatures of from about 100 to 150° C. for several minutes or longer to further cure the relief image formed upon development. After development and any post-development cure, the substrate surface bared by development may then be selectively processed, for example chemically etching or plating substrate areas bared of photoresist in accordance with procedures known in the art. Suitable etchants include a hydrofluoric acid etching solution and a plasma gas etch such as an oxygen plasma etch.

All documents mentioned herein are incorporated herein by reference. The following non-limiting examples are illustrative of the invention.

EXAMPLES 1 AND 2

PAG Syntheses

Example 1

Synthetic procedures of TPS ODOT-DMFS PAG (Triphenylsulphonium Hexahydro-4,7-Epoxyisobenzofuran-1(3H)-one, 6-(2,2'-difluoro-2-sulfonatoacetic acid ester)

Scheme

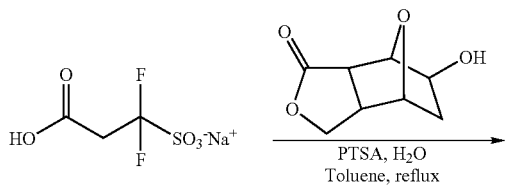

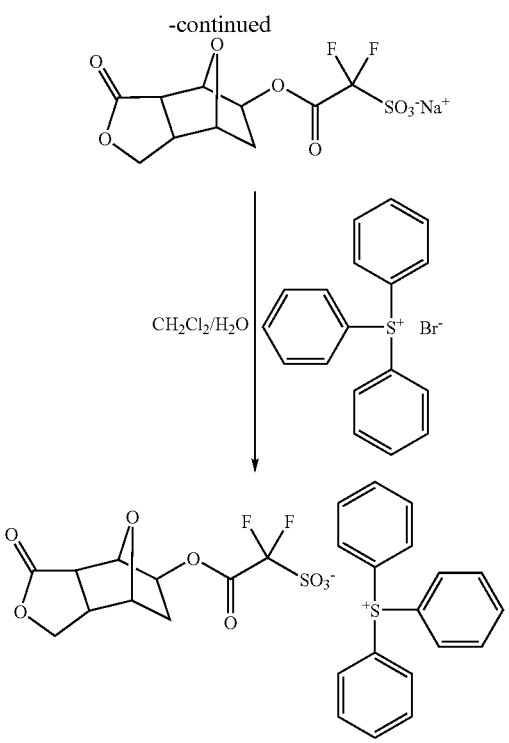

As shown in the above Scheme, a mixture of sodium difluorosulfoacetate (5 g), 9-Hydroxy-4,10-dioxa-tricyclo[5.2.1.02,6]decan-3-one)(4.21 g) and p-toluene sulfonic acid monohydrate (9.5 g) in toluene (50 mL) was refluxed for 3 days. The reaction mixture was cooled to room temperature and filtered. The solids were extracted with acetonitrile (2×50 mL) and filtered. The acetonitrile filtrate was concentrated to dryness. The residue was partitioned between water (50 mL) and methylene chloride (30 mL). Phases were separated. The aqueous phase was washed with methylene chloride (2×30 mL) and used in next step without further purification.

The above aqueous solution was treated with triphenylsulfonium bromide (8.6 g) and methylene chloride (50 mL). The mixture was stirred at room temperature for 24 h. Phases were separated. The organic phase was washed with water (3×30 mL), dried with sodium sulfate, and concentrated. The residue was purified by column chromatography (SiO$_2$, 3% methanol in methylene chloride) to give TPS-ODOT-DFMS (7.5 g) PAG as a white solid.

Example 2

Synthetic procedures of TPS Hydroxy-NL-TFBS PAG (Triphenylsulfonium; 1,1,2,2-tetrafluoro-4-(2-hydroxy-5-oxo-4-oxa-tricyclo[4.2.1.03,7]nonane-9-carbonyloxy)-butane-1-sulfonate)

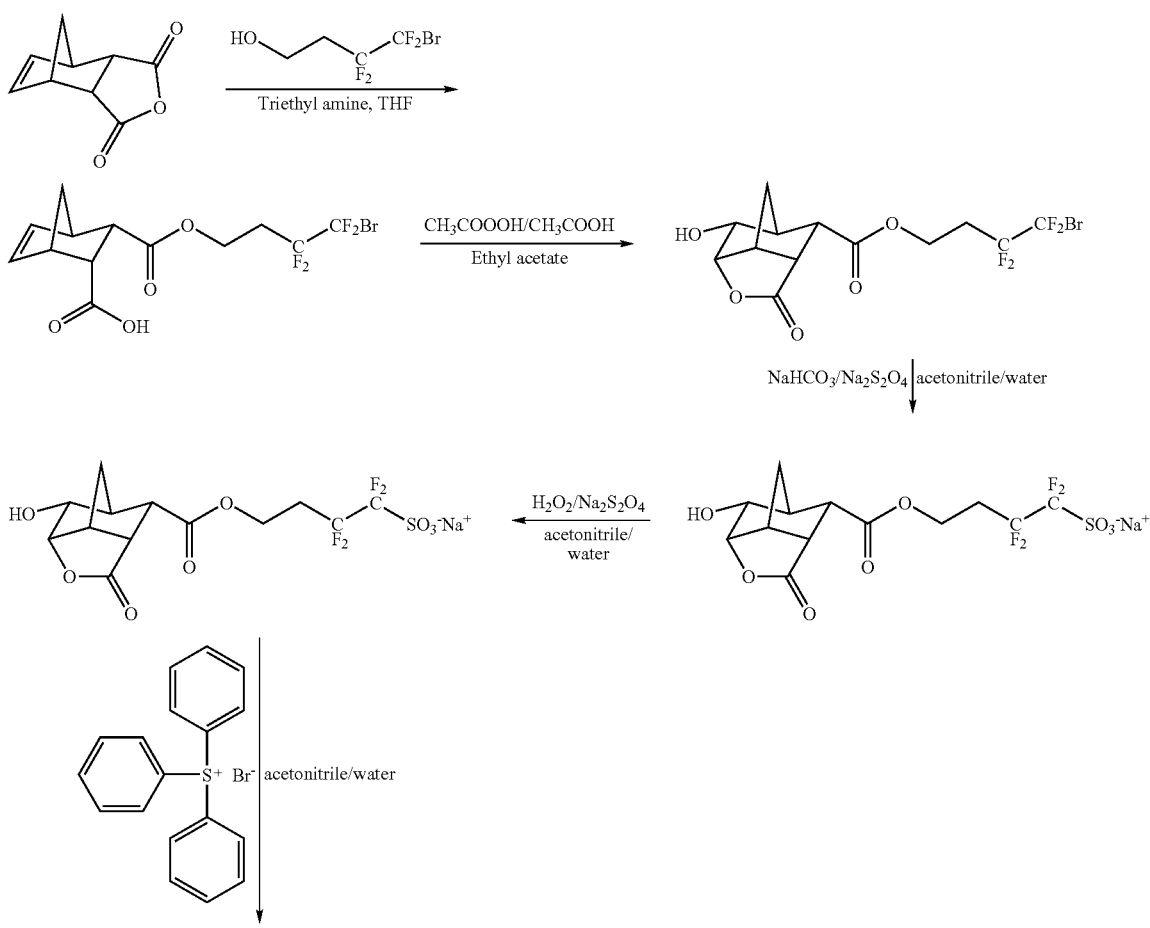

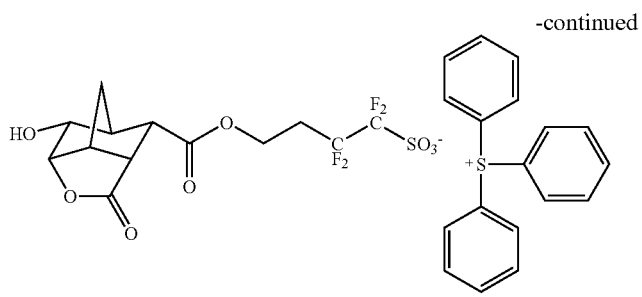

1. Synthesis of 5-norbornene-2,3-dicarboxylic acid mono-(4-bromo-3,3,4,4-tetrafluoro-butyl) ester Triethylamine (14.8 g, 146.2 mmol, 1.5 equiv) was slowly added to a mixture of Cis-5-norbornene-Endo-2,3-dicarboxylic anhydride (16 g, 97.5 mmol, 1 equiv) and 4-bromo-3,3,4,4-tetrafluorobutan-1-ol (21.9 g, 97.5 mmol) in 250 ml of methylene chloride and stir for 3 days. After acidify the mixture with 150 ml 6N hydrochloric acid, the organic layer was dried and concentrated. After dry in vacuum oven at 50 C for overnight, 33 gram of 5-norbornene-2,3-dicarboxylic acid mono-(4-bromo-3,3,4,4-tetrafluoro-butyl) ester was obtained.

2. Synthesis of 2-Hydroxy-5-oxo-4-oxa-tricyclo[4.2.1.03,7]nonane-9-carboxylic acid 4-bromo-3,3,4,4-tetrafluoro-butyl ester Peracetic acid (14.1 g, 32 wt % aqueous solution, 59.1 mmol, 1 equiv) was added dropwise into the mixture of 5-norbornene-2,3-dicarboxylic acid mono-(4-bromo-3,3,4,4-tetrafluoro-butyl) ester (23 g, 59.1 mmol) with 200 ml of ethyl acetate. The resulting mixture was refluxed overnight and washed with 200 ml saturated sodium bicarbonate aqueous solution twice. After dried over anhydrous magnesium sulfate, the organic layer was concentrated and purified through silica gel chromatography with 50/50 (v/v) of ethyl acetate/heptane as elute. 16 grams of crystalline product 2-Hydroxy-5-oxo-4-oxa-tricyclo[4.2.1.03,7]nonane-9-carboxylic acid 4-bromo-3,3,4,4-tetrafluoro-butyl ester was obtained

3. Synthesis of Sodium; 1,1,2,2-tetrafluoro-4-(2-hydroxy-5-oxo-4-oxa-tricyclo[4.2.1.03,7]nonane-9-carbonyloxy)-butane-1-sulfinate 2-Hydroxy-5-oxo-4-oxa-tricyclo[4.2.1.03,7]nonane-9-carboxylic acid 4-bromo-3,3,4,4-tetrafluoro-butyl ester (15.4 g, 38.0 mmol) in 300 ml of acetonitrile was added slowly into a freshly made solution of sodium dithionate (15.6 g, 85% pure, 76.0 mmol, 2 equiv) and sodium bicarbonate (12.8 g, 152.1 mmol, 4 equiv). The resulting mixture was refluxed for 3 hours. Take the organic layer and concentrate to dryness. 15 g of crude product Sodium; 1,1,2,2-tetrafluoro-4-(2-hydroxy-5-oxo-4-oxa-tricyclo[4.2.1.03,7]nonane-9-carbonyloxy)-butane-1-sulfinate was used for next step without further purifications.

4. Synthesis of Sodium; 1,1,2,2-tetrafluoro-4-(2-hydroxy-5-oxo-4-oxa-tricyclo[4.2.1.03,7]nonane-9-carbonyloxy)-butane-1-sulfonate Hydrogen peroxide (10.8 g, 30 wt % solution, 95.0 mmol, 2.5 equiv) and sodium tungstate dihydrate (0.03 g, 0.0024 equiv) was added into a mixture of Sodium; 1,1,2,2-tetrafluoro-4-(2-hydroxy-5-oxo-4-oxa-tricyclo[4.2.1.03,7]nonane-9-carbonyloxy)-butane-1-sulfinate salt (15 g, 38 mmol) with 300 ml of acetonitrile and 300 ml of water. After stirring at room temperature for overnight, 2 equiv of sodium sulfite was added into the mixture and stir for additional 30 mins. The organic layer of the product was concentrated and precipitated into large quantity of methyl t-butyl ether. 14.9 grams of the product Sodium; 1,1,2,2-tetrafluoro-4-(2-hydroxy-5-oxo-4-oxa-tricyclo[4.2.1.03,7]nonane-9-carbonyloxy)-butane-1-sulfonate was obtained.

5. Synthesis of TPS Hydroxy-NL-TFBS PAG (Triphenylsulfonium; 1,1,2,2-tetrafluoro-4-(2-hydroxy-5-oxo-4-oxa-tricyclo[4.2.1.03,7]nonane-9-carbonyloxy)-butane-1-sulfonate)

Sodium; 1,1,2,2-tetrafluoro-4-(2-hydroxy-5-oxo-4-oxa-tricyclo[4.2.1.03,7]nonane-9-carbonyloxy)-butane-1-sulfonate (14.9 g, 36.2 mmol, 1 equiv) and triphenylsulfonium bromide (12.8, 36.2 mmol) was mixed with 300 ml methylene chloride and 300 ml water. The mixture was stirred for 48 hrs and organic phase was separated. After washing with water (6×250 ml), the organic phase was concentrated and purified with silica gel chromatography with 95/5 (v/v) of methylene chloride/methanol as elute. The product was dried and 12.3 g of crystalline PAG Triphenylsulfonium; 1,1,2,2-tetrafluoro-4-(2-hydroxy-5-oxo-4-oxa-tricyclo[4.2.1.03,7]nonane-9-carbonyloxy)-butane-1-sulfonate was obtained.

Example 3

Photoresist Preparation and Lithographic Processing

A photoresist of the invention is prepared by mixing the following components with amounts expressed as weight percent based on total weight of the resist compositions:

| Resist components | Amount (wt. %) |
|---|---|
| Resin binder | 15 |
| Photoacid generator | 3 |
| Ethyl lactate | 81 |

The resin binder is a terpolymer of (2-methyl-2-adamantyl methacrylate/beta-hydroxy-gamma-butyrolactone methacrylate/cyano-norbornyl methacrylate. The photoacid generator was the compound prepared in Example 1 above. Those resin and PAG components are admixed in the ethyl lactate solvent.

The formulated resist composition is spin coated onto ARC-coated six inch silicon wafers and softbaked via a vacuum hotplate at 130° C. for 60 seconds. The resist coating layer is exposed through a photomask at 248 nm, and then the exposed coating layers are post-exposure baked at 130° C. for 90 seconds. The coated wafers are then treated with 0.26N aqueous tetramethylammonium hydroxide solution to develop the imaged resist layer and provide a relief image.

Example 4

Additional Photoresist Preparation and Processing

A photoresist composition is prepared by admixing the following materials in the specified amounts:
1. Resin component: Terpolymer of (2-methyl-2-adamantyl methacrylate/beta-hydroxy-gamma-butyrolactone methacrylate/cyano-norbornyl methacrylate in an amount of 6.79 weight % based on total weight of the photoresist composition;
2. Photoacid generator compound: compound of Example 2 above in an amount of 0.284 weight % based on total weight of the photoresist composition;
3. Base additive: N-Alkyl Caprolactam in an amount of 0.017 weight % based on total weight of the photoresist composition;
4. Surfactant: R08 (fluorine-containing surfactant, available from Dainippon Ink & Chemicals, Inc.) in an amount of 0.0071 weight % based on total weight of the photoresist composition
5. Substantially non-mixable additive: Polymer of Example 5 below prepared as described in Example 5 below and in an amount of 0.213 weight % based on total weight of the photoresist composition.
6. Solvent component: propylene glycol monomethyl ether acetate to provide about a 90 percent fluid composition.

This photoresist composition is spin-coated onto silicon wafers, dried on vacuum hotplate to remove soft-plate and then exposed in an immersion lithography process with aqueous immersion fluid directly contacting the dried photoresist layer. In that immersion system, the photoresist layers is exposed to patterned 193 nm radiation at a dose of about 24.1 mJ/cm$^2$.

The photoresist layers is then post-exposed baked (such as at about 120° C.). Thereafter, the photoresist layer is developed with 0.26N alkaline aqueous developer solution.

Example 5

Polymer Synthesis

A carboxy terpolymer resin having the following structure was prepared as described below:

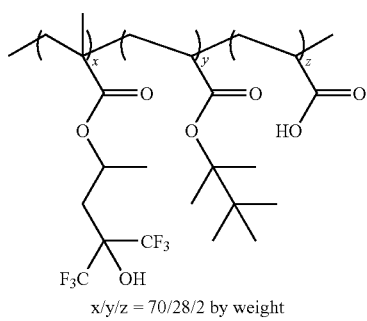

x/y/z = 70/28/2 by weight

A. Monomer and initiator mixture: weigh 7.00 g of CH$_3$(CH=CH)C(=O)OCH(CH$_3$)CH$_2$C(CF$_3$)$_2$OH (the first monomer), 2.80 g of (CH$_2$=CH)C(=O)OC(CH(CH$_3$))$_2$C(CH$_3$)$_3$ (the second monomer) and 2.0 g of acetic anhydride (the third monomer), 0.42 g of Trignox-23 (initiator) and 17.0 g PGMEA (solvent) into a feeding vial.
B. Reactor: 30 g of PGMEA in a reactor and maintain at 85° C.
C. Feed A into B: A is fed into B with a constant feeding rate in 120 minutes.
D. Holding temperature: after feeding A into B, the temperature of the reactor is maintained at 85° C. for additional two hrs, then allow the reactor temp to cool down naturally to room temperature.

The carboxy resin from the reactor can be used in a photoresist composition without further purification.

The foregoing description of the invention is merely illustrative thereof, and it is understood that variations and modifications can be effected without departing from the spirit or scope of the invention as set forth in the following claims.

What is claimed is:
1. A chemically-amplified positive photoresist composition comprising:
a resin binder and a photoacid generator compound selected from one of the following compounds:

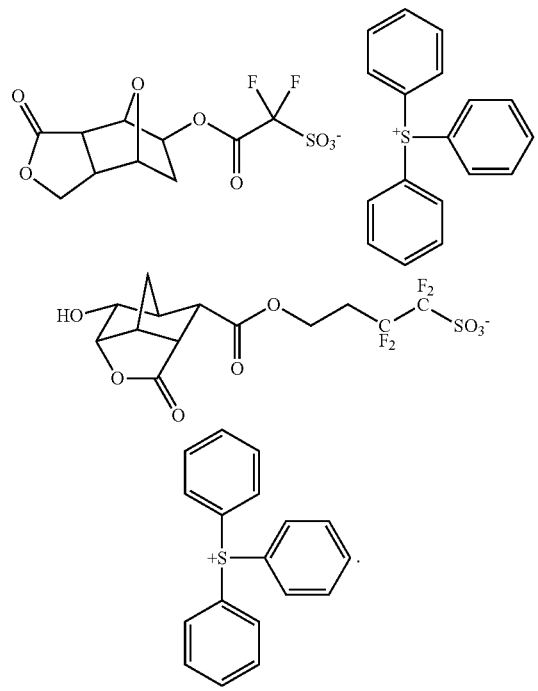

2. A method for forming a photoresist relief image on a substrate comprising:
(a) applying a coating layer of a photoresist composition of claim 1 on a substrate; and
(b) exposing the coating layer to patterned activating radiation and developing the exposed coating layer to provide a relief image.

* * * * *